United States Patent
Kubo

(10) Patent No.: US 11,957,037 B2
(45) Date of Patent: Apr. 9, 2024

(54) METHOD FOR MANUFACTURING LIGHT-EMITTING DEVICE

(71) Applicant: SHARP KABUSHIKI KAISHA, Sakai (JP)

(72) Inventor: Masumi Kubo, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 430 days.

(21) Appl. No.: 17/431,666

(22) PCT Filed: Feb. 20, 2019

(86) PCT No.: PCT/JP2019/006375
§ 371 (c)(1),
(2) Date: Aug. 17, 2021

(87) PCT Pub. No.: WO2020/170373
PCT Pub. Date: Aug. 27, 2020

(65) Prior Publication Data
US 2022/0123271 A1 Apr. 21, 2022

(51) Int. Cl.
*H10K 71/00* (2023.01)
*H10K 50/115* (2023.01)
*H10K 59/35* (2023.01)

(52) U.S. Cl.
CPC .......... *H10K 71/00* (2023.02); *H10K 50/115* (2023.02); *H10K 59/35* (2023.02)

(58) Field of Classification Search
None
See application file for complete search history.

(56) References Cited

U.S. PATENT DOCUMENTS

2018/0108841 A1\* 4/2018 Li .......................... H10K 71/18

FOREIGN PATENT DOCUMENTS

JP 2015-028139 A 2/2015

\* cited by examiner

*Primary Examiner* — Cory W Eskridge
(74) *Attorney, Agent, or Firm* — ScienBiziP, P.C.

(57) ABSTRACT

A method for manufacturing a light-emitting device comprises:
performing first light irradiation; subsequent to the performing first application, that involves irradiating with light using a first photomask, from above the substrate, the position where the first solution is applied, and forming a first exposure region exposed by the first light irradiation in which the first ligand melts and the first solvent vaporizes, and a first non-exposure region at a position different from a position exposed by the first light irradiation,
performing first cooling, subsequent to the performing first light irradiation, that involves lowering a temperature of the first quantum dot to a temperature equal to or lower than a melting point of the first ligand and solidifying the first ligand; and performing first removal, subsequent to the performing first cooling, that involves washing an upper layer relative to the substrate to remove the first solution in the first non-exposure region.

15 Claims, 11 Drawing Sheets

METHOD FOR MANUFACTURING LIGHT-EMITTING DEVICE

TECHNICAL FIELD

The disclosure relates to a method for manufacturing a light-emitting device provided with a light-emitting element including quantum dots.

BACKGROUND ART

PTL 1 discloses a method for forming a layer containing semiconductor nanoparticles (quantum dots) from a curable resin (photosensitive resin) in which the semiconductor nanoparticles are dispersed.

CITATION LIST

Patent Literature

PTL 1: JP 2015-28139 A

SUMMARY

When forming a quantum dot layer from a photosensitive resin in which quantum dots are dispersed, it is difficult to obtain a quantum dot layer in which quantum dots are densely layered. When such a quantum dot layer having a low density of quantum dots is employed as a function layer of, for example, a light-emitting device, the luminous efficiency of the light-emitting device may be lowered.

In order to solve the above problem, a method for manufacturing a light-emitting device of the disclosure is a method for manufacturing a light-emitting device provided with, on a substrate, a light-emitting element including a first electrode, a second electrode, and a quantum dot layer interposed between the first electrode and the second electrode, the method including forming the quantum dot layer. The forming the quantum dot layer includes: performing first application that involves applying a first solution containing a plurality of first quantum dots each including a first core and a first shell with which the first core is coated, a first ligand to coordinate with each of the plurality of first quantum dots, and a first solvent on a position overlapping with the substrate; performing first light irradiation, subsequent to the performing first application, that involves irradiating with light using a first photomask, from above the substrate, the position where the first solution is applied, and forming a first exposure region exposed by the first light irradiation in which the first ligand melts and the first solvent vaporizes, and a first non-exposure region at a position different from a position exposed by the first light irradiation; performing first cooling, subsequent to the performing first light irradiation, that involves lowering a temperature of the first quantum dot to a temperature equal to or lower than a melting point of the first ligand and solidifying the first ligand; and performing first removal, subsequent to the performing first cooling, that involves washing an upper layer relative to the substrate with the first solvent to remove the first solution in the first non-exposure region.

Advantageous Effects of Disclosure

According to the above configuration, it is possible to manufacture a light-emitting device that includes a quantum dot layer having a higher density of quantum dots in only a specific position.

DESCRIPTION OF EMBODIMENTS

Figure 1:
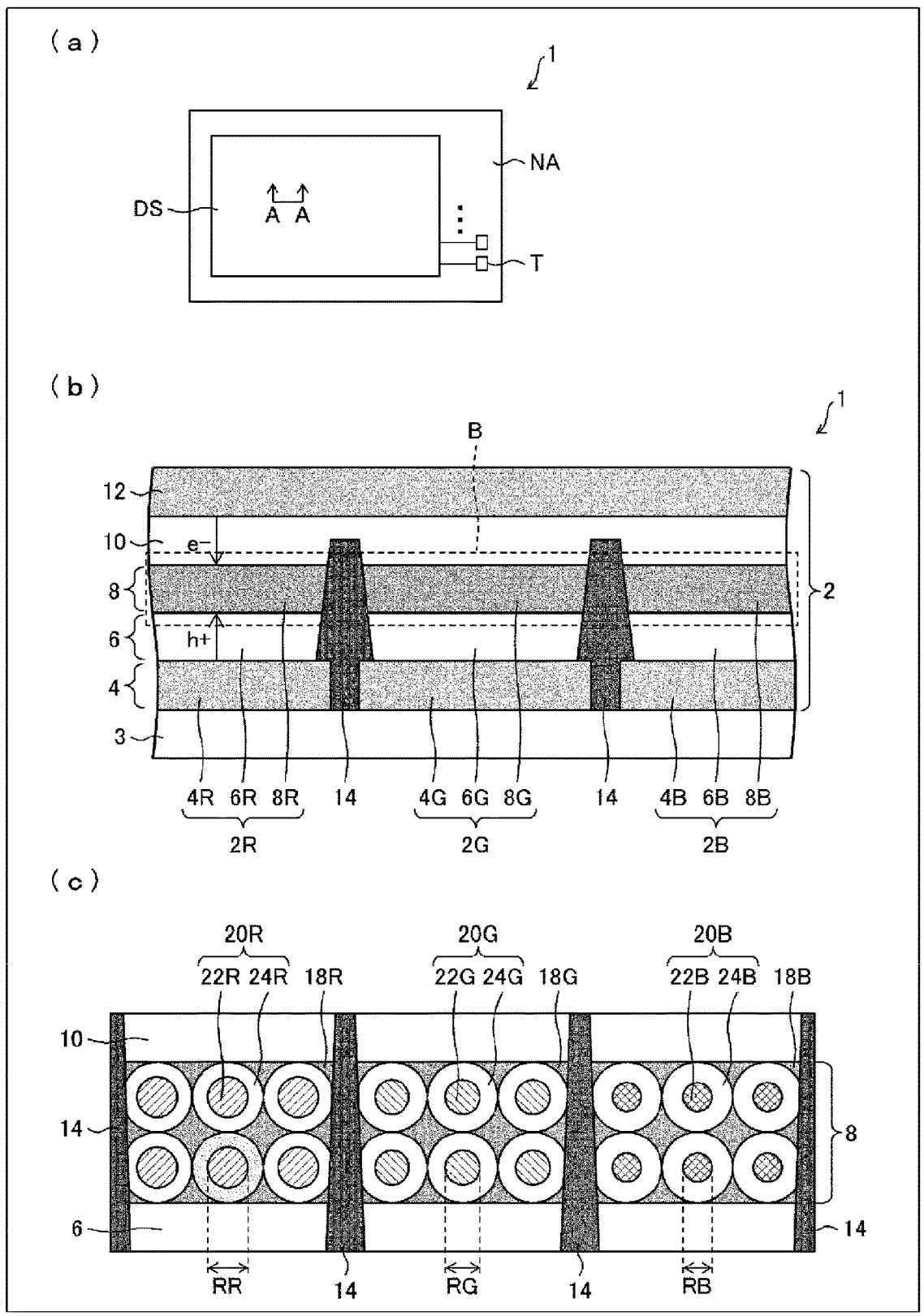
FIG. 1 includes a schematic top view and a schematic cross-sectional view of a light-emitting device according to a first embodiment of the disclosure, and a schematic enlarged view of a perimeter of a light-emitting layer of the light-emitting device.

First Embodiment (a) of FIG. 1 is a schematic top view of a light-emitting device 1 according to the present embodiment. (b) of FIG. 1 is a cross-sectional view taken along a line A-A in the direction of the arrows in (a) of FIG. 1. (c) of FIG. 1 is an enlarged cross-sectional view of a region B (b) of FIG. 1, that is, an enlarged cross-sectional view of a perimeter of a second light-emitting layer 8G to be described later.

As illustrated in a) of FIG. 1, the light-emitting device 1 according to the present embodiment includes a light-emitting face DS from which light emission is extracted and a frame region NA surrounding a periphery of the light-emitting face DS. In the frame region NA, a terminal T may be formed into which a signal for driving a light-emitting element of the light-emitting device 1 described in detail later is input.

At a position overlapping with the light-emitting face DS in plan view, as illustrated in (b) of FIG. 1, the light-emitting device 1 according to the present embodiment includes a light-emitting element layer 2 and an array substrate 3. The light-emitting device 1 has a structure in which respective layers of the light-emitting element layer 2 are layered on the array substrate 3, in which a thin film transistor (TFT; not illustrated) is formed. In the present specification, a direction from the light-emitting element layer 2 to the array substrate 3 of the light-emitting device 1 is referred to as "downward direction", and a direction from the light-emitting element layer 2 to the light-emitting face DS of the light-emitting device 1 is referred to as "upward direction".

The light-emitting element layer 2 includes, on a first electrode 4, a first charge transport layer 6, a light-emitting layer 8 as a quantum dot layer, a second charge transport layer 10, and a second electrode 12, which are sequentially layered from the lower layer. The first electrode 4 of the light-emitting element layer 2 formed in the upper layer of the array substrate 3 is electrically connected to the TFT of the array substrate 3. In the present embodiment, the first electrode 4 is an anode electrode and the second electrode 12 is a cathode electrode, for example.

In the present embodiment, the light-emitting element layer 2 includes a first light-emitting element 2R, a second light-emitting element 2G, and a third light-emitting element 2B. The first light-emitting element 2R, the second light-emitting element 2G, and the third light-emitting element 2B are QLED elements in which the light-emitting layer 8 includes a semiconductor nanoparticle material, that is, a quantum dot material.

Each of the first electrode 4, the first charge transport layer 6, and the light-emitting layer 8 is separated by edge covers 14. In particular, in the present embodiment, the first electrode 4 is, by the edge covers 14, separated into a first electrode 4R for the first light-emitting element 2R, a first electrode 4G for the second light-emitting element 2G, and a first electrode 4B for the third light-emitting element 2B. The first charge transport layer 6 is, by the edge covers 14, separated into a first charge transport layer 6R for the first light-emitting element 2R, a first charge transport layer 6G for the second light-emitting element 2G, and a first charge transport layer 6B for the third light-emitting element 2B. Further, the light-emitting layer 8 is, by the edge covers 14, separated into a first light-emitting layer 8R, the second light-emitting layer 8G, and a third light-emitting layer 8B.

The second charge transport layer 10 and the second electrode 12 are not separated by the edge covers 14, and are each formed in a shared manner. As illustrated in (b) of FIG. 1, the edge covers 14 may be formed at, the positions to cover side surfaces of the first electrode 4 and the vicinity of peripheral end portions of an upper face thereof.

In the present embodiment, the first light-emitting element 2R includes the first electrode 4R, the first charge transport layer 6R, the first light-emitting layer 8R, the second charge transport. layer 10, and the second electrode 12. The second light-emitting element 2G includes the first electrode 4G, the first charge transport layer 6G, the second light-emitting layer 8G, the second charge transport layer 10, and the second electrode 12. Furthermore, the third light-emitting element 2B includes the first electrode 4B, the first charge transport layer 6B, the third light-emitting layer 8B, the second charge transport layer 10, and the second electrode 12.

In the present embodiment, the first light-emitting layer 8R, the second light-emitting layer 8G, and the third light-emitting layer 8B emit red light that is light of a first color, green light that is light of a second color, and blue light that is light of a third color, respectively. In other words, the first light-emitting element 2R, the second light-emitting element 2G, and the third light-emitting element 2B are light-emitting elements that emit the red light, the green light, and the blue light, respectively, which are different colors from each other.

Here, the blue light is, for example, light having a light emission center wavelength in a wavelength band of 400 nm or more and 500 nm or less. Further, the green light is, for example, light having a light emission center wavelength in a wavelength band of greater than 500 nm and 600 nm or less. Further, the red light is, for example, light having a light emission center wavelength in a wavelength band of greater than 600 nm and 780 nm or less.

The first electrode 4 and the second electrode 12 include conductive materials and are electrically connected to the first charge transport layer 6 and the second charge transport layer 10, respectively. Of the first electrode 4 and the second electrode 12, the electrode closer to the light-emitting face DS is a transparent electrode.

In particular, in the present embodiment, the array substrate 3 is a transparent substrate, and the first electrode 4 is a transparent electrode. The second electrode 12 may be a reflective electrode. Therefore, light from the light-emitting layer 8 passes through the first charge transport layer 6, the first electrode 4, and the array substrate 3, and is emitted from the light-emitting face DS to the outside of the light-emitting device 1. Due to this, the light-emitting device 1 is configured as a bottom-emitting type light-emitting device. Since both the light emitted in the upward direction from the light-emitting layer 8 and the light emitted in the downward direction from the light-emitting layer 8 are available as light emission from the light-emitting device 1, the light-emitting device 1 can improve the usage efficiency of the light emitted from the light-emitting layer 8.

Note that the configuration of the first electrode 4 and the second electrode 12 described above is an example, and may be configured with other materials.

The first charge transport layer 6 is a layer that transports charges from the first electrode 4 to the light-emitting layer 8. The first charge transport layer 6 may have a function of inhibiting the transport of charges from the second electrode 12. In the present embodiment, the first charge transport layer 6 may be a hole transport layer that transports positive holes from the first electrode 4, which is an anode electrode, to the light-emitting layer 8.

The second charge transport layer 10 is a layer that transports the charge from the second electrode 12 to the light-emitting layer S. The second charge transport layer 10 may have a function of inhibiting the transport of the charges from the first electrode 4. In the present embodiment, the second charge transport layer 10 may be an electron transport layer that transports electrons from the second electrode 12, which is a cathode electrode, to the light-emitting layer 8.

Next, the configuration of the light-emitting layer 8 will be described in detail with reference to (c) of FIG. 1, which is a schematic cross-sectional view of the region B in (b) of FIG. 1, that is, a schematic cross-sectional view of the periphery of the light-emitting layer 8. In the present embodiment, a specific configuration of the light-emitting layer 8 will be described while exemplifying the members of the first light-emitting layer 8R, the second light-emitting layer 8G. and the third light-emitting layer 8B. Note that (c) of FIG. 1 is illustrated in such a manner that the aspect ratio of the region B is changed for the sake of convenience in illustration.

In the present embodiment, the first light-emitting layer 8R includes a plurality of first quantum dots 20R, with each of which a first ligand 18R coordinates. The second light-emitting layer 8G also includes a plurality of second quantum dots 20G, with each of which a second ligand 18G coordinates, and the third light-emitting layer 8B also includes a plurality of third quantum dots 20B, with each of which a third ligand 18B coordinates.

Each of the first quantum dot 20R, the second quantum dot 20G, and the third quantum dot 20B absorbs light having a shorter wavelength than the wavelength of light emitted by each of the above quantum dots itself. in particular, each of the above-discussed quantum dots absorbs ultraviolet light. Further, each of the quantum dots generates heat when absorbing light.

In the present embodiment, each of the first quantum dot 20R, the second quantum dot 20G, and the third quantum dots 20B includes a core/shell structure. The first quantum dot 20R includes a first core 22R and a first shell 24R, with which the periphery of the first core 22R is coated. Similarly, the second quantum dot 20G includes a second core 22G and a second shell 24G, with which the periphery of the second core 22G is coated, and the third quantum dot 20B includes a third core 22B and a third shell 24B, with which the periphery of the third core 22B is coated. Each of the first quantum dot 20R, the second quantum dot 20G, and the third quantum dot 20B may contain a known quantum dot material.

In the present embodiment, a diameter RR of the first core 22R, a diameter RG of the second core 22G, and a diameter RB of the third core 22B are different from one another. In particular, the diameter RG of the second core 22G, which is a core at a position overlapping with the second light-emitting element 2G serving as a green light-emitting element, is smaller than the diameter RR of the first core 22R, which is a core at a position overlapping with the first light-emitting element 2R serving as a red light-emitting element. The diameter RG of the second core 22G is greater than the diameter RB of the third core 22B, which is a core at a position overlapping with the third light-emitting element 2B serving as a blue light-emitting element.

Each of the first quantum dot 20R, the second quantum dot 20G, and the third quantum dots 20B may have a multi-shell structure in which a plurality of shells are provided around each core. In this case, the first shell 24R, the second shell 24G, and the third shell 24B each refers to a shell corresponding to the outermost layer among the plurality of shells mentioned above.

In the present embodiment, by adjusting the film thicknesses of the first shell 24R, the second shell 24G, and the third shell 24B, the diameters of the first quantum dot 20R, the second quantum dot 20G, and the third quantum dot 20B may be made substantially the same. As a result, when the same numbers of first quantum dots 20R, second quantum dots 20G, and third quantum dots 20B are respectively layered, the total film thickness of each of the quantum dot layers may be set approximately the same.

The first ligand 18R, the second ligand 18G, and the third ligand 18B may coordinate with the quantum dots on the outer surfaces of the first shell 24R, the second shell 24G, and the third shell 24B, respectively, and may fill voids between the quantum dots, The first ligand 18R, second ligand 18G, and third ligand 18B may be identical, may be able to adopt a known ligand, and may be, for example, trioctylphosphine oxide (TOPO).

In the present embodiment, the quantum dots in each of the light-emitting layers 8 may be layered while being aligned in such a manner as to be in contact with each other via the shells. However, no such limitation is intended, and in each of the light-emitting layers 8, quantum dots that are not in contact with each other may be present. In each of the light-emitting layers 8, a structure in which quantum dots are dispersed in the ligand may be formed.

Figure 2:
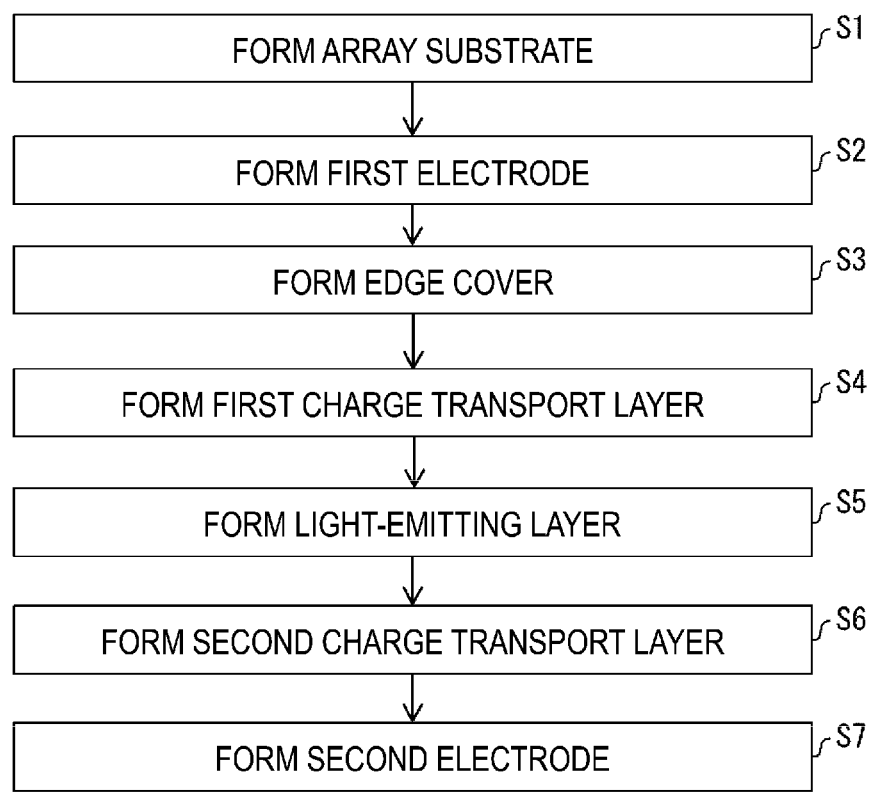
FIG. 2 is a flowchart for illustrating a method for manufacturing a light-emitting device according to the first embodiment of the disclosure.

Next, a method for manufacturing the light-emitting device 1 according to the present embodiment will be described with reference to FIG. 2. FIG. 2 is a flowchart for describing the method for manufacturing the light-emitting device 1 according to the present embodiment.

First, an array substrate is formed (step S1). Formation of the array substrate may be performed by forming a plurality of TFTs on the substrate to match positions of the subpixels.

Next, the first electrode 4 is formed (step S2). In step S2, for example, after a transparent electrode material having electrical conductivity, such as ITO, is film-formed by sputtering, the first electrode 4 may be formed for each subpixel by patterning while matching a shape of the subpixel. Alternatively, the first electrode may be formed for each subpixel by vapor-depositing a transparent electrode material by using a vapor deposition mask.

Next, the edge covers 14 are formed (step S3). The edge covers 14, after being applied on the array substrate 3 and the first electrode 4, may be obtained by patterning while leaving the positions covering the side surfaces and peripheral end portions of the first electrodes 4 between the adjacent first electrodes 4. The patterning of the edge covers 14 may be performed by photolithography.

Next, the first charge transport layer 6 is formed (step S4). The first charge transport layer 6 may be formed for each subpixel by separately patterning with an ink-jet method, vapor deposition using a mask, or patterning using photolithography.

Next, the light-emitting layer 8 is formed (step S5). The step of forming the light-emitting layer 8 will be described in more detail with reference to FIG. 3.

Figure 3:
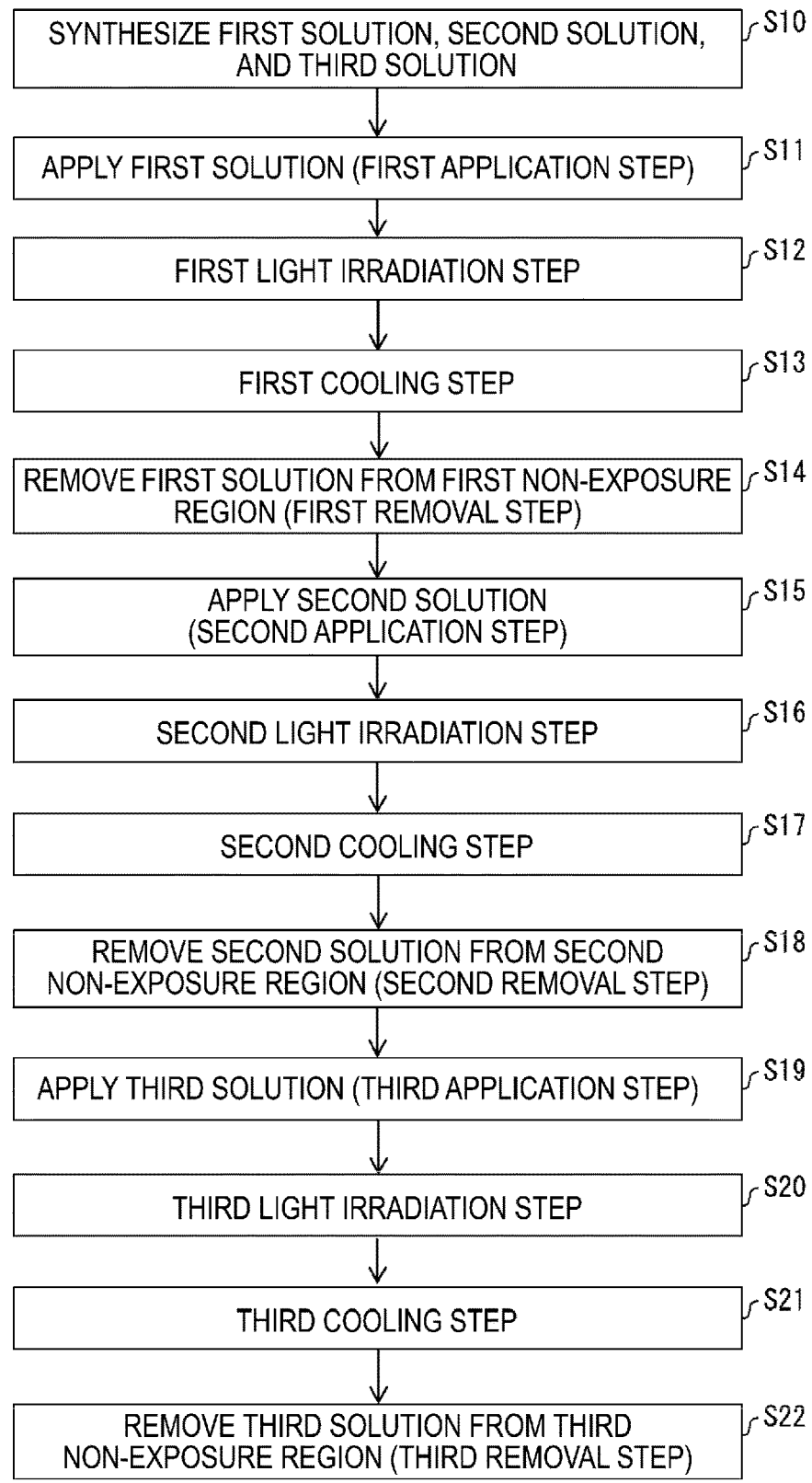
FIG. 3 is a flowchart for illustrating a method for forming a light-emitting layer according to the first embodiment of the disclosure.

FIG. 3 is a flowchart for describing the step of forming the light-emitting layer corresponding to a step of forming a quantum dot layer in the present embodiment.

Figure 4:
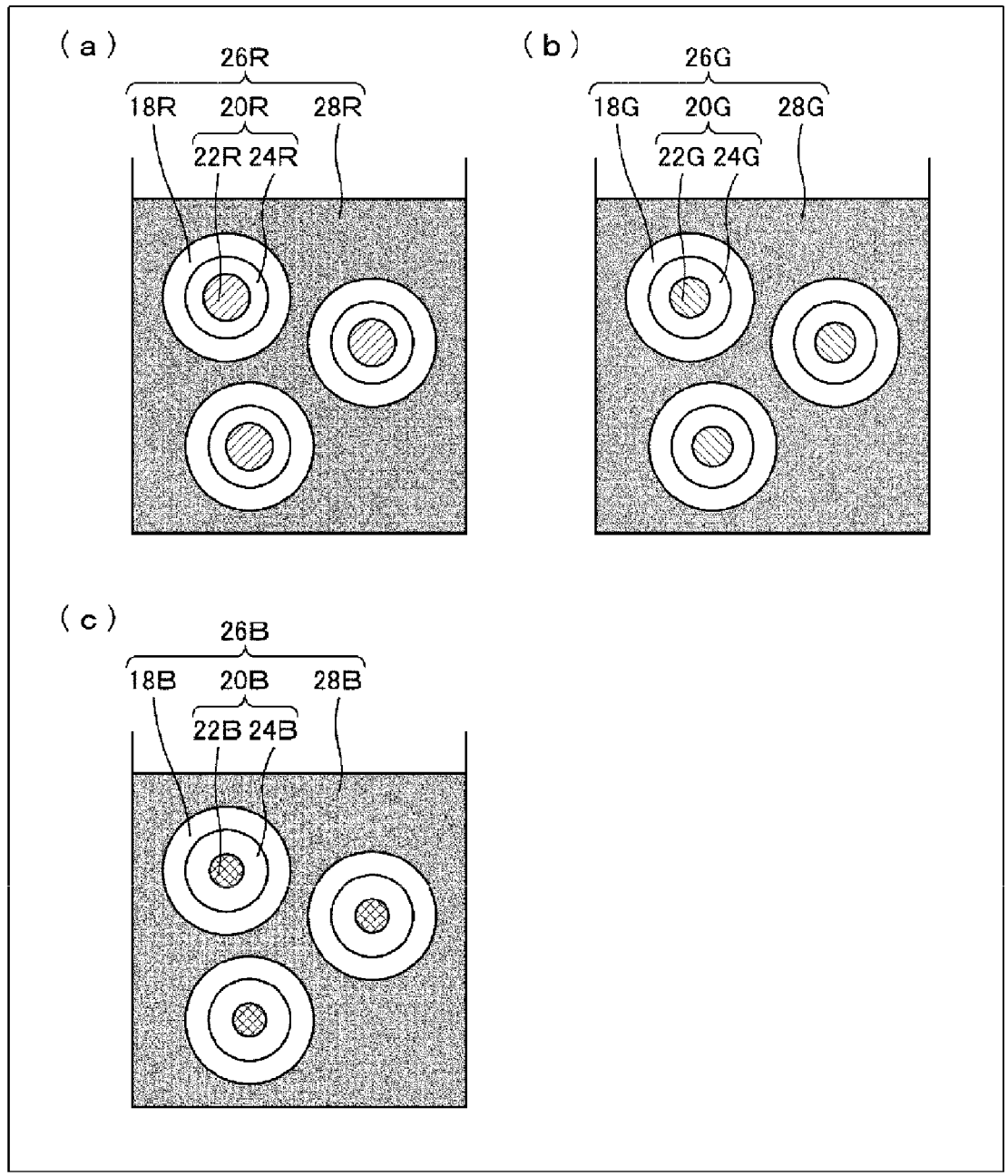
FIG. 4 is a schematic view for illustrating solutions used in a step of forming a light-emitting layer according to the first embodiment of the disclosure.

First, a first solution 26R, a second solution 26G, and a third solution 26B to be used in the step of forming the light-emitting layer are synthesized (step S10), FIG. 4 is a schematic view for describing the configuration of each of the first solution 26R, the second solution 26G, and the third solution 26B.

The first solution 26R contains a plurality of the first quantum dots 20R, with each of which the first ligand 18R is coordinated, and a first solvent 28R, in which the plurality of first quantum dots 20R are dispersed. Similarly, the second solution 26G contains the second ligand 18G, the second quantum dots 20G, and a second solvent 28G; the third solution 26B contains the third ligand 18B, the third quantum dots 20B, and a third solvent 28B.

The first solvent 28R, the second solvent 28G, and the third solvent 28B may be identical, may adopt, a known organic solvent, and may be, for example, hexane.

Each step, subsequent to step S10, of the step of forming the light-emitting layer will be described using forming-step cross-sectional views respectively illustrated in FIG. 5 through FIG. 9. In FIG. 5 through FIG. 9, cross-sectional views of the first light-emitting element. 2R, the second light-emitting element 2G, and the third light-emitting element 2B are illustrated in such a manner that each of the light-emitting elements is set at the corresponding position.

Figure 5:
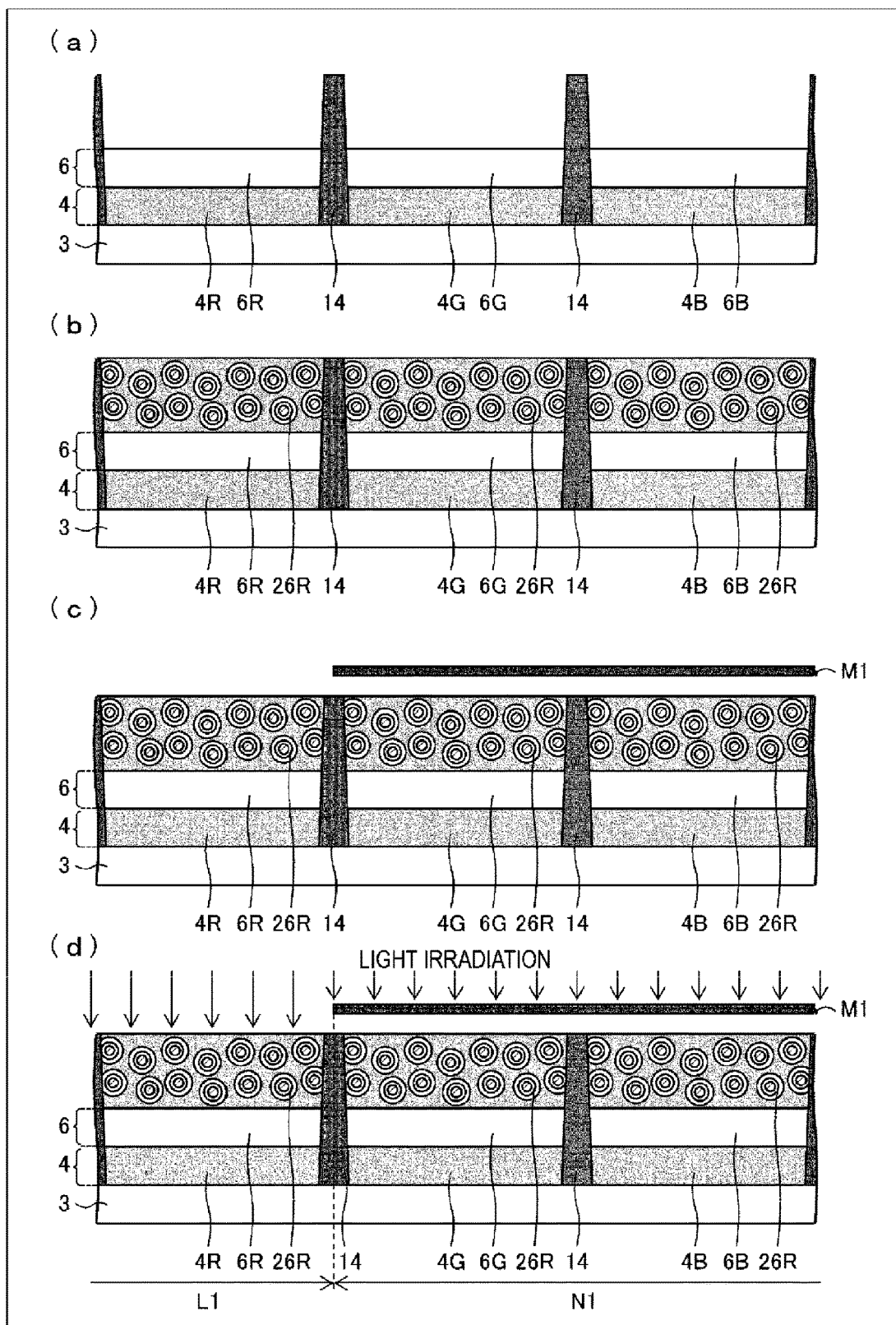
FIG. 5 is a forming-step cross-sectional view for illustrating a step of forming a light-emitting layer according to the first embodiment of the disclosure.

As illustrated in (a) of FIG. 5, the formation up to the first charge transport layer 6 has been performed on the array substrate 3 until the step of forming the light-emitting layer. Subsequent to step S10, a step of first application (step S11) is performed in which the first solution 26R illustrated in (b)

of FIG. 5 is applied on a position overlapping with the array substrate 3 as the step of the first application.

By the step of the first application, the first solution 26R is applied on the positions respectively overlapping with the first electrode 4R corresponding to the first light-emitting element 2R, the first electrode 4G corresponding to the second light-emitting element 2G, and the first electrode 4B corresponding to the third light-emitting element 2B.

Next, as illustrated in (c) of FIG. 5, a first photomask M1 is disposed on the upper side overlapping with the array substrate 3. The first photomask M1 includes a blocking portion configured to block light and an opening configured to transmit light. In the present embodiment, for example, the blocking portion preferably has a function of blocking ultraviolet light. The opening of the first photomask M1 is formed in such a manner that the opening is formed only at a position overlapping with the first electrode 4G corresponding to the first light-emitting element 2R when the first photomask M1 is disposed above the array substrate 3. In other words, as illustrated in (c) of FIG. 5, when the first photomask MI is disposed above the array substrate 3, an upper portion of the first solution 26R at a position not overlapping with the first electrode 4R is blocked by the blocking portion of the first photomask M1.

Subsequently, in a state in which the first photomask M1 is disposed above the array substrate 3, a step of first light irradiation is performed (step S12), where the first light irradiation is performed. The first light irradiation can be performed by irradiating the first solution 26R on the array substrate 3 with light such as ultraviolet light from above the first photomask M1, as illustrated in (d) of FIG. 5.

As a result, as illustrated in (d) of FIG. 5, in the first light irradiation, a first exposure region L1, which is a region irradiated with light, is formed at a position overlapping with the opening of the first photomask M1. On the other hand, in the first light irradiation, a region different from the region irradiated with light, that is, a first non-exposure region N1, which is a region not irradiated with light, is formed at a position overlapping with the blocking portion of the first photomask M1.

Due to the exposure by the first light irradiation, the first quantum dots 20R contained in the first solution 26R at a position overlapping with the first exposure region that is, at a position overlapping with the first electrode 4R, absorb the emitted light and generate heat. By continuing the exposure by the first light irradiation, the temperature around the first quantum dots 20R exceeds a melting point of the first ligand 18R and a boiling point of the first solvent 28R.

Thus, in the step of the first light irradiation, the melting of the first ligand 18R and the vaporization of the first solvent 28R occur only at the position overlapping with the first exposure region L1. Accordingly, at the position overlapping with the first exposure region L1 in the step of the first light irradiation, the first solvent 28R is removed and the first quantum dots 20R are dispersed in the melted first ligand 18R.

The melting point of TOPO is in a range from 50 degrees Celsius to 54 degrees Celsius, and the boiling point of hexane is in a range from 68.5 degrees Celsius to 69.1 degrees Celsius. Accordingly, when the first ligand 18R is TOPO and the first solvent 28R is hexane, the melting point of the first ligand 18R is lower than or equal to the boiling point of the first solvent 28R. Thus, in the step of the first light irradiation, the first solvent 28R vaporizes after the first ligand 18R has melted.

In a case where the melting of the first ligand 18R is earlier than the vaporization of the first solvent 28R, imme-diately after the vaporization of the first solvent 28R, aggregate of the first quantum dots 20R, around which the solid first ligand 18R is attached, is formed in an upper layer relative to the first charge transport layer 6. The aggregate is unstable as a film, which may bring about film peeling of the aggregate in some case. Accordingly, in the step of the first light irradiation, from the perspective of forming a stable film including the first quantum dots 20R, it is preferable that the first solvent 28R vaporize after the melting of the first ligand 18R.

In addition, in the present embodiment, the materials of the first ligand 18R and the first solvent 28R may respectively be selected such that the melting point of the first ligand 18R is higher than the boiling point of the first solvent 28R. In this case, in the step of the first light irradiation, the first solvent 28R vaporizes before the first ligand 18R melts.

Figure 6:
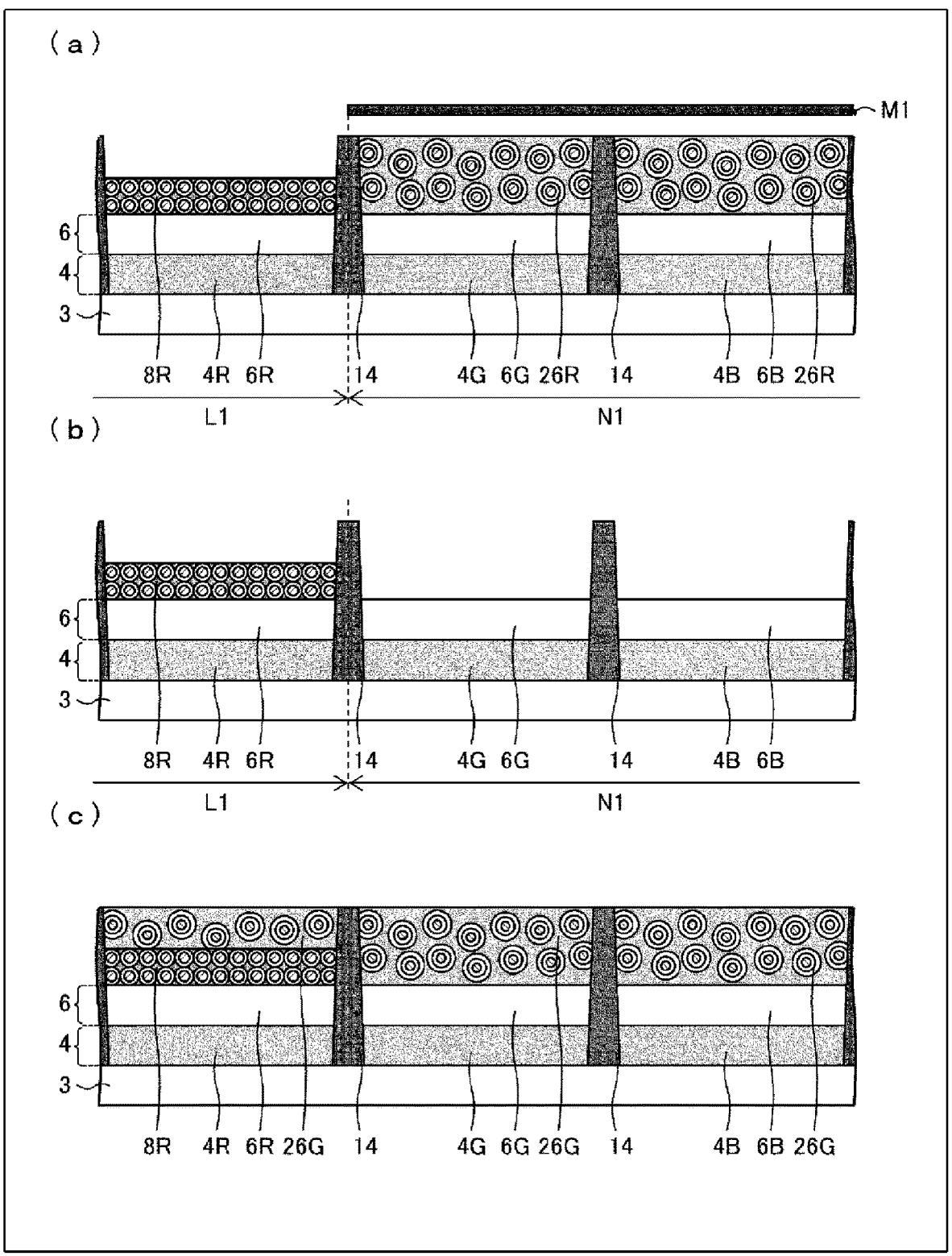
FIG. 6 is another forming-step cross-sectional view for illustrating a step of forming a light-emitting layer according to the first embodiment of the disclosure.

At the point in time when the melting of the first ligand 18R and the vaporization of the first solvent 28R are completed at the position overlapping with the first exposure region the first light irradiation is stopped and a step of first cooling is performed in which the first ligand 18R is solidified (step S13). With this, the layering of the first quantum dots 20R, with each of which the first ligand 18R coordinates, is completed, and the first light-emitting layer 8R illustrated in (a) of FIG. 6 is obtained.

Subsequently, a step of first removal is performed in which the first photomask M1 is removed and the first solution 26R is removed at the position overlapping with the first non-exposure region N1 (step S14). The step of the first removal is performed, for example, by washing the upper layer relative to the array substrate 3 with the first solvent 28R. The first light-emitting layer 8R is not removed even by washing with the first solvent 28R because of having a structure in which the first quantum dots 20R are contained in the solidified first ligand 18R. As a result, only the first solution 26R is removed from the upper layer relative to the array substrate 3, as illustrated in (b) of FIG. 6. With this, the step of forming the first light-emitting layer 8R is completed.

The first solvent 28R used in the washing is identical to the first solvent 28R contained in the first solution 26R. Because of this, the first solution 26R removed by the step of the first removal may he used in the step of the first application when manufacturing another light-emitting device 1. Accordingly, when manufacturing the plurality of light-emitting devices 1 each provided with the first light-emitting layer 8R, the total amount of the first solution 26R required can be reduced, and an increase in the manufacturing cost can be reduced.

The first solvent 28R is highly compatible with the first ligand 18R. Because of this, by using the first solvent 28R for washing the first solution 26R, damage to the first ligand 18R and the first quantum dots 20R may be reduced compared to washing with a developing solution for peeling a film containing a photosensitive material. Accordingly, by washing the first solution 26R with the method described above, damage to the first light-emitting layer 8R may be reduced, and thus a reduction in luminous efficiency of the first light-emitting layer 8R may be suppressed.

Subsequently, a step of second application (step S15) is performed in which the second solution 26G illustrated in (c) of FIG. 6 is applied on a position overlapping with the array substrate 3 as the step of the second application. The step of the second application is performed by the same method as that of the step of the first application except that the solution to be applied is the second solution 26G in place of the first solution 26R.

Figure 7:
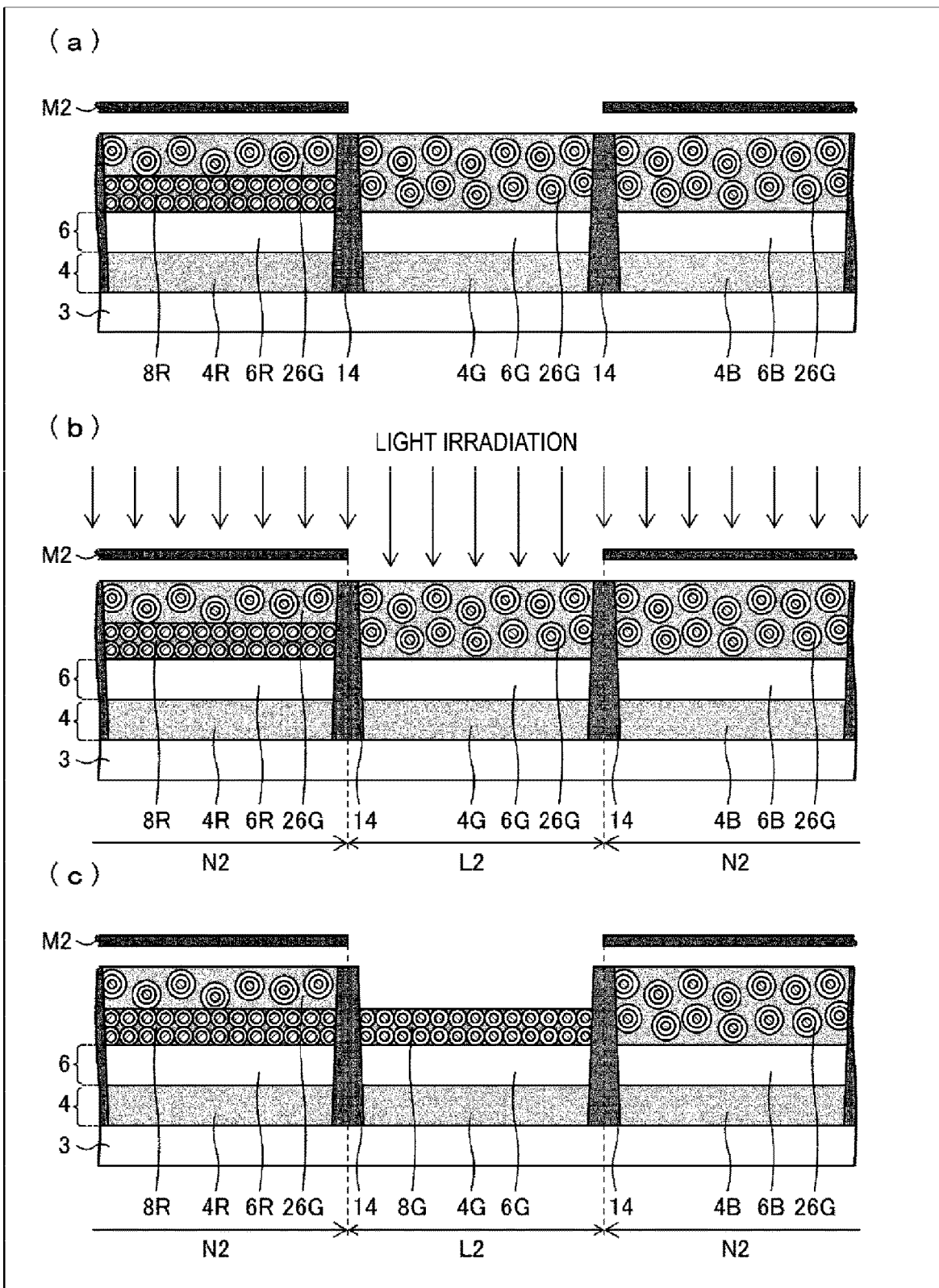
FIG. 7 is another forming-step cross-sectional view for illustrating a step of forming a light-emitting layer according to the first embodiment of the disclosure.

Next, as illustrated in (a) of FIG. 7, a second photomask M2 is disposed on the upper side overlapping with the array substrate 3. An opening of the second photomask M2 is formed in such a manner that the opening is formed only at a position overlapping with the second electrode 4G corresponding to the second light-emitting element 2G when the second photomask M2 is disposed above the array substrate 3. Except for the above point, the second photomask M2 has the same configuration as the first photomask M1. In other words, as illustrated in (a) of FIG. 7, when the second photomask M2 is disposed above the array substrate 3, an upper portion of the second solution 26G at a position not overlapping with the second electrode 4G is blocked by a blocking portion of the second photomask M2.

Subsequently, in a state in which the second photomask M2 is disposed above the array substrate 3, a step of second light irradiation is performed (step S16), where the second light irradiation is performed. The second light irradiation is performed by the same method as that of the first light irradiation except that the photomask disposed above the array substrate 3 is the second photomask M2 in place of the first photomask M1.

As a result, as illustrated in (b) of FIG. 7, in the second light irradiation, a second exposure region L2, which is a region irradiated with light, is formed at a position overlapping with the opening of the second photomask M2. On the other hand, in the second light irradiation, a region different from the region irradiated with light, that is, a second non-exposure region N2, which is a region not irradiated with light, is formed at a position overlapping with the blocking portion of the second photomask M2.

Due to the exposure by the second light irradiation, the second quantum dots 20G contained in the second solution 26G at a position overlapping with the second exposure region L2, that is, at a position overlapping with the second electrode 4G, absorb the emitted light and generate heat. By continuing the exposure by the second light irradiation, the temperature around the second quantum dots 20G exceeds a melting point of the second ligand 18G and a boiling point of the second solvent 28G.

Thus, in the step of the second light irradiation, the melting of the second ligand 18G and the vaporization of the second solvent 28G occur only at the position overlapping with the second exposure region L2. Accordingly, at the position overlapping with the second exposure region L2 in the step of the second light irradiation, the second solvent 28G is removed and the second quantum dots 20G are dispersed in the melted. second ligand 18G.

At the point in time when the melting of the second ligand 18G and the vaporization of the second solvent 28G are completed at the position overlapping with the second exposure region L2, the second light irradiation is stopped and a step of second cooling is performed in Which the second ligand 18G is solidified (step S17). With this, the layering of the second quantum dots 20G, with each of which the second ligand 18G coordinates, is completed, and the second light-emitting layer 8G illustrated in (c) of FIG. 7 is obtained.

Subsequently, a step of second removal is performed in which the second photomask M2 is removed and the second solution 26G is removed at the position overlapping with the second non-exposure region N2 (step S18). The step of the second removal is performed, for example, by washing the upper layer relative to the array substrate 3 with the second solvent 28G, similar to the step of the first removal. As a result, only the second solution 26G is removed from the upper layer relative to the array substrate 3, as illustrated in (a) of FIG. 8. With this, the step of forming the second light-emitting layer 8G is completed.

Figure 8:
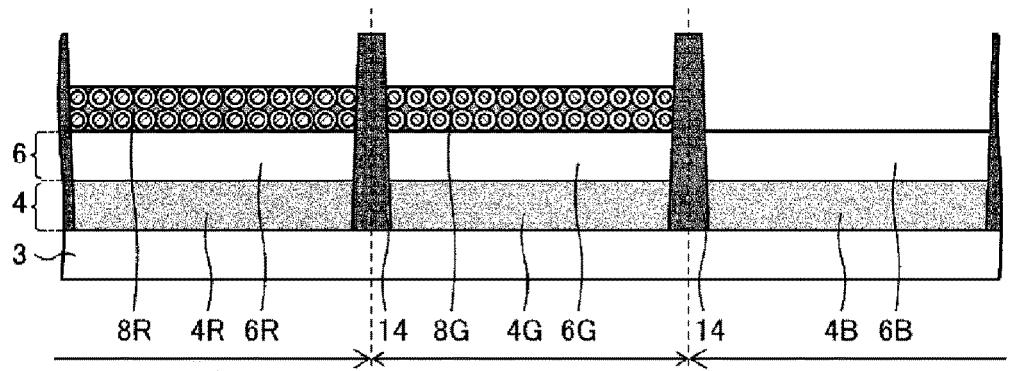
FIG. 8 is another forming-step cross-sectional view for illustrating a step of forming a light-emitting layer according to the first embodiment of the disclosure.
Figure 8:
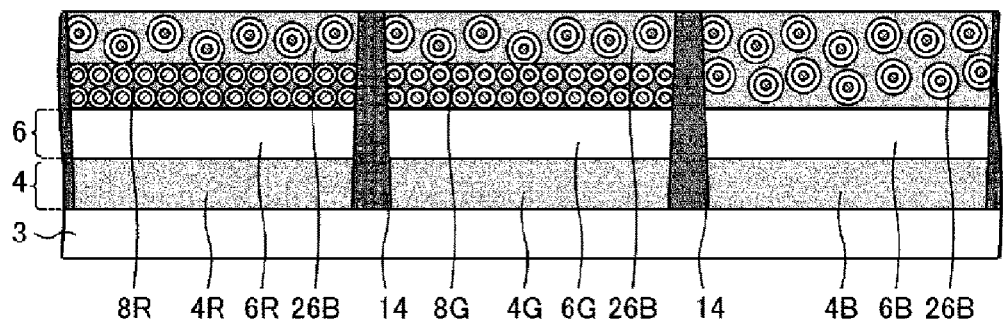
Figure 8:
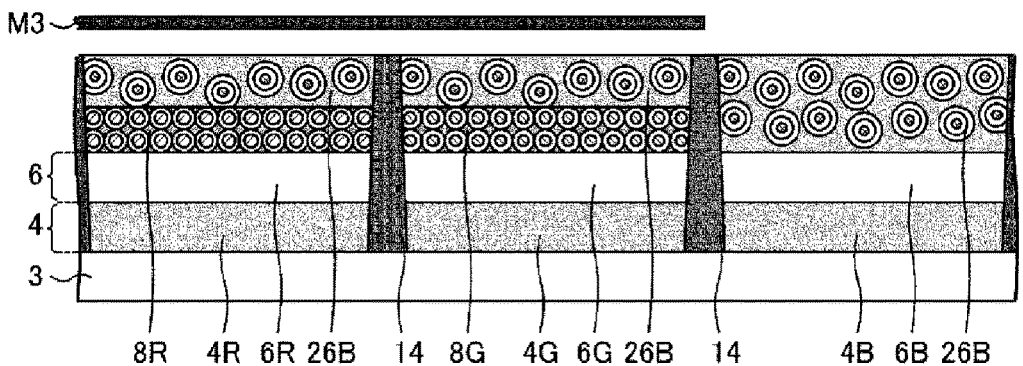

Subsequently, a step of third application (step S19) is performed in which the third solution 26B illustrated in (b) of FIG. 8 is applied on a position overlapping with the array substrate 3 as the step of the third application. The step of the third application is performed by the same method as that of the step of the first application except that the solution to be applied is the third solution 26B in place of the first solution 26R.

Next, as illustrated in (c) of FIG. 8, a third photomask M3 is disposed on the upper side overlapping with the array substrate 3. An opening of the third photomask M3 is formed in such a manner that the opening is formed only at a position overlapping with the third electrode 4B corresponding to the third light-emitting element 28 when the third photomask M3 is disposed above the array substrate 3. Except for the above point, the third photomask M3 has the same configuration as the first photomask M1. In other words, as illustrated in (c) of FIG. 8, when the third photomask M3 is disposed above the array substrate 3, an upper portion of the third solution 26B at a position not overlapping with the third electrode 4B is blocked by a blocking portion of the third photomask M3.

Subsequently, in a state in which the third photomask M3 is disposed above the array substrate 3, a step of third light irradiation is performed (step S20), where the third light irradiation is performed. The third light irradiation is performed by the same method as that of the first light irradiation except that the photomask disposed above the array substrate 3 is the third photomask M3 in place of the first photomask M1.

Figure 9:
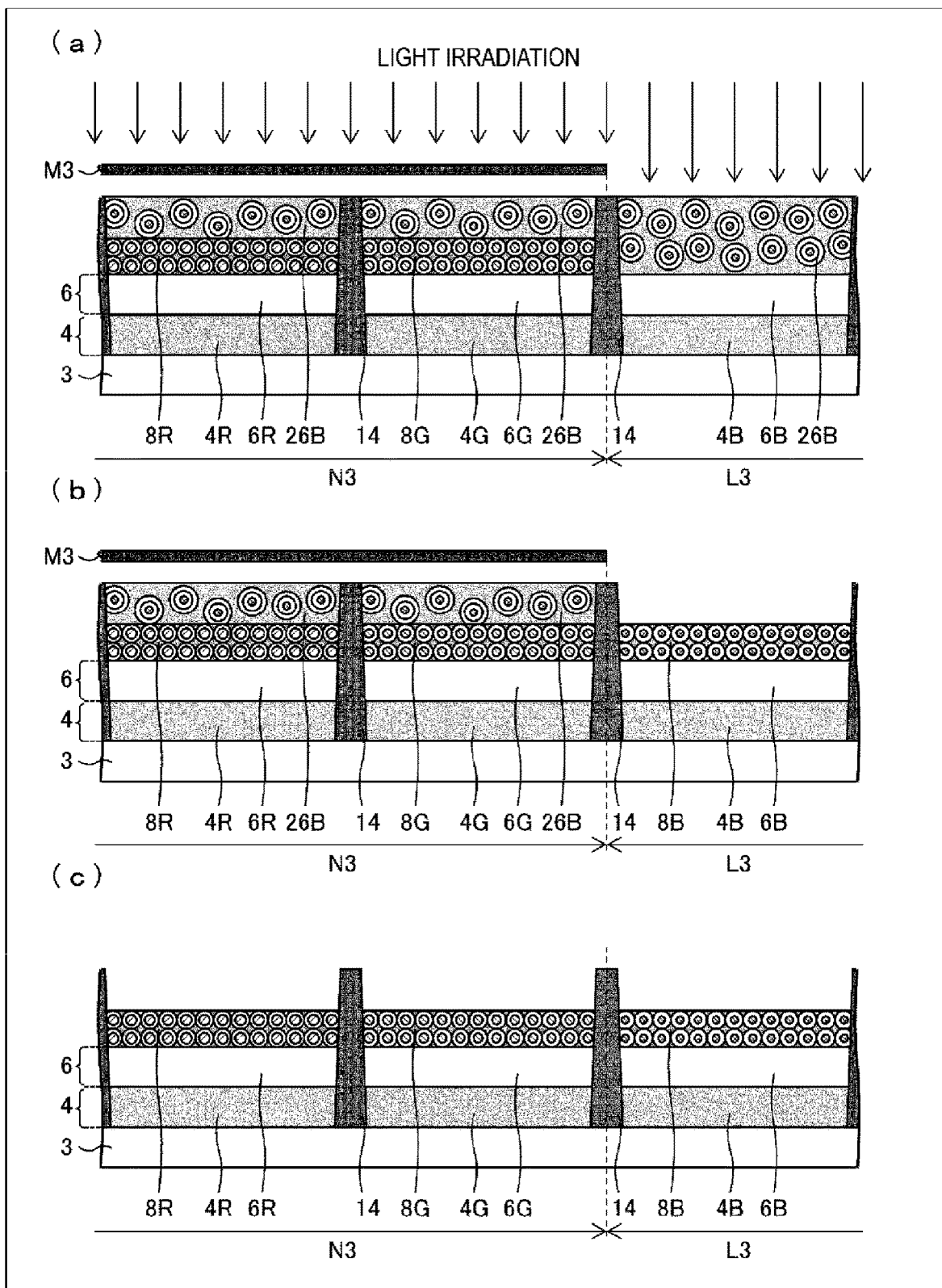
FIG. 9 is another forming-step cross-sectional view for illustrating a step of forming a light-emitting layer according to the first embodiment of the disclosure.

As a result, as illustrated in (a) of FIG. 9, in the third light irradiation, a third exposure region L3, which is a region irradiated with light, is formed at a position overlapping with an opening of the third photomask M3. On the other hand, in the third light irradiation, a region different from the region irradiated with light, that is, a third non-exposure region N3, which is a region not irradiated with light, is formed at a position overlapping with the blocking portion of the third photomask M3.

Due to the exposure by the third light irradiation, the third quantum dots 20B contained in the third solution 26B at a position overlapping with the third exposure region that is, at a position overlapping with the third electrode 4B, absorb the emitted light and generate heat. By continuing the exposure by the third light irradiation, the temperature around the third quantum dots 20B exceeds a melting point of the third ligand 18B and a boiling point of the third solvent 28B.

Thus, in the step of the third light irradiation, the melting of the third ligand 18B and the vaporization of the third solvent 28B occur only at the position overlapping with the third exposure region L3. Accordingly, at the position overlapping with the third exposure region L3 in the step of the third light irradiation, the third solvent 28B is removed and the third quantum dots 20B are dispersed in the melted third ligand 18B.

At the point in time when the melting of the third ligand 18B and the vaporization of the third solvent 28B are completed at the position overlapping with the third exposure region L3, the third light irradiation is stopped and a step of third cooling is performed in which the third ligand 18B is solidified (step S21). With this, the layering of the third quantum dots 20B, with each of which the third ligand 18B coordinates, is completed, and the third light-emitting layer 8B illustrated in (b) of FIG. 9 is obtained.

Subsequently, the third photomask M3 is removed, and a step of third removal is performed in which the third solution 26B is removed at the position overlapping with the third non-exposure region N3 (step S22). The step of the third removal is performed, for example, by washing the upper layer relative to the array substrate 3 with the third solvent 28B, similar to the step of the first removal. By doing so, only the third solution 26B is removed from the upper layer relative to the array substrate 3, as illustrated in (c) of FIG. 9. With this, the step of forming the third light-emitting layer 8B is completed. As a result, the step of forming the light-emitting layer 8 illustrated in (c) of FIG. 9 is completed.

In the present embodiment, as illustrated in FIGS. 5 through 9, each solution is separated by the edge covers 14 in each of the application steps. This reduces a flow of the solution in the non-exposure region adjacent to the exposure region onto the light-emitting layer having already been formed in each of the light irradiation steps. However, in a case where the above-mentioned solution flow does not occur because of each light irradiation step being short or the like, it is unnecessary for the edge cover 14 to be formed to have a height able to separate each solution, and it is sufficient that the edge cover 14 has a height able to cover an edge of the first electrode 4.

Subsequent to the step of forming the light-emitting layer, the second charge transport layer 10 is formed (step S6). The second charge transport layer 10 may be applied and formed in common to all of the subpixels by a spin coat technique or the like.

Finally, the second electrode 12 is formed (step S7). The second electrode 12 may be film-formed in common to all of the subpixels by vapor deposition or the like. As described above, the light-emitting element layer 2 is formed on the array substrate 3, and the light-emitting device 1 illustrated in FIG. 1 is obtained.

In the method for manufacturing the light-emitting device 1 according to the present embodiment, the quantum dots in the solution are irradiated with light by each light irradiation step to cause the melting of the ligand and the vaporization of the solvent to occur, thereby layering the quantum dots. As a result, the volume of the solvent, in which the quantum dots disperse is reduced compared to a case in which the quantum dots are layered by irradiating a photosensitive material in which the quantum dots disperse with light.

Thus, by the step of forming the quantum dot layer in the present embodiment, it is possible to form the quantum dot layer having a high density of quantum dots at only a specific position by partial exposure. Therefore, even when partial exposure is employed, the density of quantum dots in the quantum dot layer of the light-emitting device 1 of the present embodiment may be sufficiently raised. As a result, in the light emitting device 1 of the present embodiment, when the quantum dot layer described above is employed as a function layer of the light-emitting element, the luminous efficiency of the light-emitting element may be improved.

In the present embodiment, the diameter RG of the second core 22G is smaller than the diameter RR of the first core 22R and is greater than the diameter RB of the third core 22B. Here, it is assumed that the film thicknesses of the shells are adjusted in all of the quantum dots to make the sizes of all of the quantum dots approximately the same between each of the luminescent colors, In this case, when light irradiation is performed under the same conditions, the amount of light emitted onto the second quantum dots 20G is smaller than the amount of light emitted onto the first quantum dots 20R and is greater than the amount of light emitted onto the third quantum dots 20B. Therefore, the energy of light irradiation required to heat the second quantum dots 20G is greater than the energy of light irradiation required to heat the first quantum dots 20R, and is smaller than the energy of light irradiation required to heat the third quantum dots 20B. In this manner, depending on the difference in luminescent color, the energy of light irradiation required to heat the quantum dots differs.

Therefore, in the present embodiment, it is preferable that the irradiation energies of the first light irradiation, second light irradiation, and third light irradiation differ from each other. In particular, the irradiation energy of light irradiation onto the second exposure region L2, which is an exposure region corresponding to the green light-emitting element, is preferably greater than the irradiation energy of light irradiation onto the first exposure region L1, which is an exposure region corresponding to the red light-emitting element. In addition, the irradiation energy of light irradiation onto the second exposure region L2 is preferably smaller than the irradiation energy of light irradiation onto the third exposure region L3, which is an exposure region corresponding to the blue light-emitting element. With the above configuration, in the formation of the quantum dot layers having different luminescent colors, conditions such as an irradiation time of each light irradiation may be more favorably adjusted, and each light irradiation step may be more efficiently performed.

In the present embodiment, the light-emitting layer 8 is formed after the formation of the array substrate 3, the first electrode 4, the edge covers 14, and the first charge transport layer 6. However, heating for the formation of the light-emitting layer 8 is enabled by the heat generation of the quantum dots by light irradiation. As a result, localized heating of the light-emitting layer 8 is enabled. Therefore, it is not absolutely necessary for the array substrate 3, the first electrode 4, the edge covers 14, and the first charge transport layer 6 to have high heat resistance against the heating in the step of light irradiation described above. Accordingly, the array substrate 3, the first electrode 4, the edge covers 14, and the first charge transport layer 6 may contain a known material.

The array substrate 3 may be, for example, a glass substrate containing alkali glass or the like. Further, the array substrate 3 may be an organic substrate containing an organic material such as polyimide. The array substrate 3 may include a flexible material such as PET, and the flexible light-emitting device 1 may be achieved.

For example, when the light-emitting element layer 2 forms a bottom-emitting type light-emitting element and the first electrode 4 is an anode electrode, ITO is commonly used for the first electrode 4, When the first charge transport layer 6 is a hole transport layer, an inorganic material such as NiO, MgNiO, $Cr_2O_3$, $Cu_2O$, or $LiNhO_3$ may contained.

In order to achieve a shape having a certain level of height and inclination, an organic material is generally used for the edge cover 14. In the present embodiment, the edge cover 14 may contain polyimide or the like.

For example, the second charge transport layer 10 may contain a material used for a known electron transport layer, and the second electrode 12 may contain a material used for a known cathode electrode.

Figure 10:
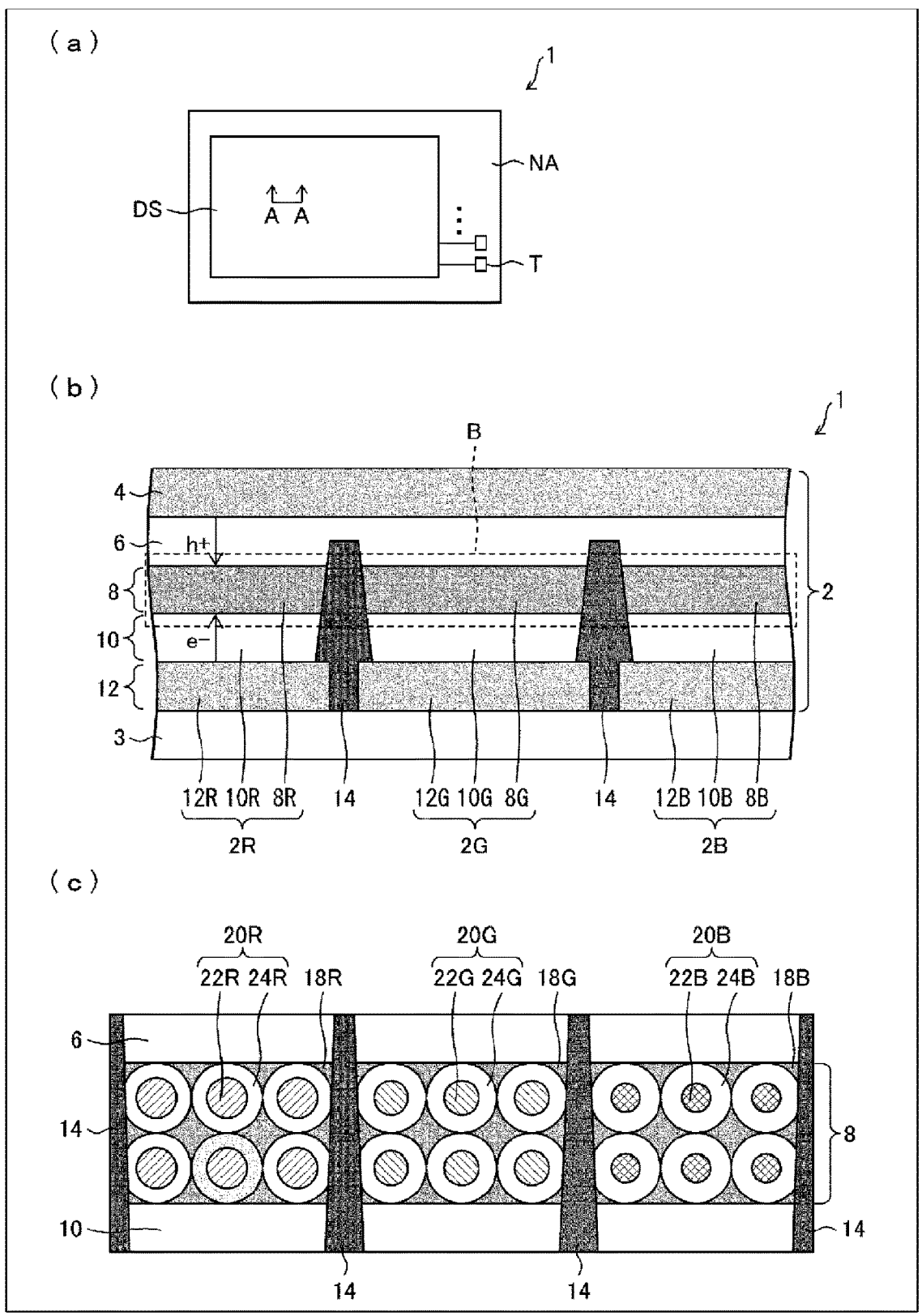
FIG. 10 includes a schematic top view and a schematic cross-sectional view of a light-emitting device according to a second embodiment of the disclosure, and a schematic enlarged view of a perimeter of a light-emitting layer of the light-emitting device.

Second Embodiment (a) of FIG. 10 is a schematic top view of a light-emitting device 1 according to the present embodiment, (b) of FIG. 10 is a cross-sectional view taken along a line A-A in the direction of the arrows in (a) of FIG. 10. (c) of FIG. 10 is an enlarged cross-sectional view of a region B in (b) of FIG. 10.

The light-emitting device 1 according to the present embodiment may have the same configuration as that of the light-emitting device 1 according to the previous embodiment except that the layering order of each of the layers in a light-emitting element layer 2 is reversed. In other words, the light-emitting element layer 2 according to the present embodiment includes a second charge transport layer 10, a light-emitting layer 8, a first charge transport layer 6, and a first electrode 4, which are sequentially layered from the lower layer on a second electrode 12.

In comparison with the light-emitting element 1 according to the previous embodiment, each of the second electrode 12 and the second charge transport layer 10 is separated by edge covers 14. In particular, in the present embodiment, the second electrode 12 is, by the edge covers 14, separated into a second electrode 12R for a first light-emitting element 2R, a second electrode 12G for a second light-emitting element 2G, and a second electrode 12B for a third light-emitting element 2B, Further, the second charge transport layer 10 is, by the edge covers 14, separated into a second charge transport layer 10R for the first light-emitting element 2R, a second charge transport layer 10G for the second light-emitting element 2G, and a second charge transport layer 10B for the third light-emitting element 2B.

In comparison with the light-emitting element 1 according to the previous embodiment, the first charge transport layer 6 and the first electrode 4 are not separated by the edge covers 14, and are each formed in a shared manner.

In the present embodiment, the first electrode 4 may be a transparent electrode and the second electrode 12 may be a reflective electrode. Therefore, light from the light-emitting layer 8 passes through the first charge transport layer 6 and the first electrode 4, and is emitted from a light-emitting face DS to the outside of the light-emitting device 1. Due to this, the light-emitting device 1 is configured as a top-emitting type light-emitting device. Because of this, in the present embodiment, an array substrate 3 need not necessarily be a transparent substrate.

The light-emitting device 1 according to the present embodiment can be manufactured by performing each of the steps illustrated in FIG. 2 in the order of step S1, step S7, step S3, step S6, step S5, step S4, and step S2 in a similar manner to that of the previous embodiment. Thus, in the present embodiment, the light-emitting layer 8 is formed after the formation of the array substrate 3, the second electrode 12, the edge covers 14, and the second charge transport layer 10.

For example, when the light-emitting element layer 2 forms a top-emitting type light-emitting element and the second electrode 12 is a cathode electrode, the second electrode 12 preferably has a function of reflecting light that is emitted in each of the light irradiation described above. With this configuration, in each of the light irradiation described above, not only the light directly emitted on the quantum dots, but also the light that has reached once to the second electrode 12 and reflected off the second electrode 12 may be effectively used as the light in each of the light irradiation. Thus, the step of light irradiation in the present embodiment may reduce the intensity of the light irradiation required to make the quantum dots irradiated with sufficient light as compared to the step of light irradiation in the previous embodiment.

From the perspective of increasing the reflectivity of light emitted in the light irradiation described above, a metal material is preferably included. The second electrode 12 may include at least a reflective metal thin film on the surface thereof. For example, the second electrode 12 may include a metal such as Al or Ag, or an intermetallic compound such as AgMg.

In the present embodiment, the top-emitting type light-emitting device 1 has been manufactured by reversing the layer formation order of the light-emitting element layer 2 with respect to the previous embodiment. However, no such limitation is intended, and in the present embodiment, the light-emitting element layer 2 may be formed by the same layer formation order as in the previous embodiment, and the top-emitting type light-emitting device 1 may be manufactured. In this case, the top-emitting type light-emitting device 1 can be manufactured by forming the first electrode 4 as a reflective electrode including a reflective metal thin film at least on the surface thereof, and forming the second electrode 12 as a transparent electrode.

Figure 11:
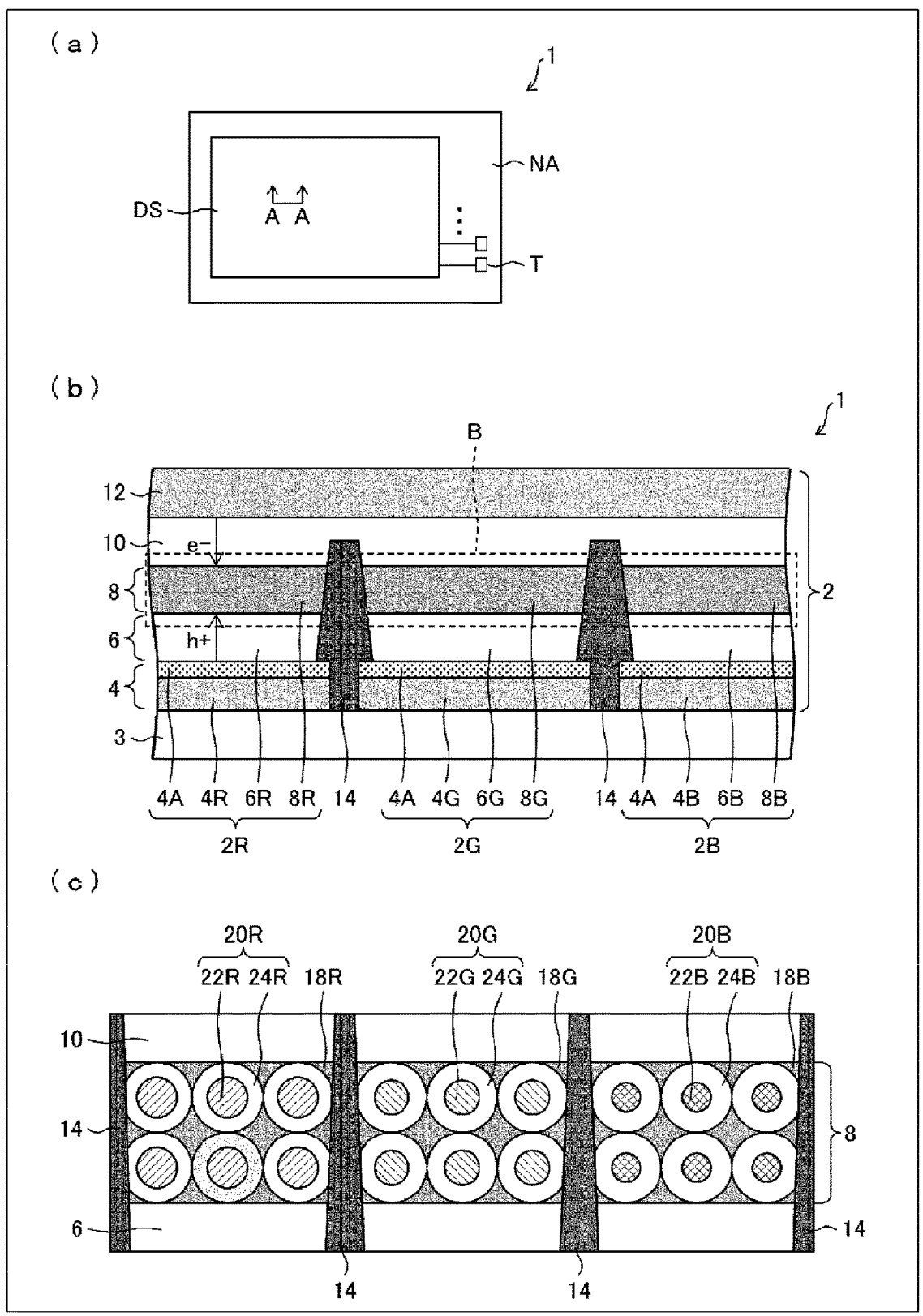
FIG. 11 includes a schematic top view and a schematic cross-sectional view of a light-emitting device according to a third embodiment of the disclosure, and a schematic enlarged view of a perimeter of a light-emitting layer of the light-emitting device.

Third Embodiment (a) of FIG. 11 is a schematic top view of a light-emitting device 1 according to the present embodiment. (b) of FIG. 11 is a cross-sectional view taken along a line A-A in the direction of the arrows in (a) of FIG. 11. (c) of FIG. 11 is an enlarged cross-sectional view of a region B (b) of FIG. 11.

The light-emitting device 1 according to the present embodiment may have the same configuration as that of the light-emitting device 1 according to the first embodiment except that a first electrode 4 includes an oxide semiconductor film 4A on a surface thereof on the side of a light-emitting layer 8.

In the present embodiment, each first electrode 4 includes the oxide semiconductor film 4A on the surface thereof. The oxide semiconductor film 4A may include, for example, a transparent oxide semiconductor of ITO or the like. In the present embodiment, the oxide semiconductor film 4A has a function of absorbing light and generating heat, In particular, the oxide semiconductor film 4A preferably generates heat by the oxide semiconductor film 4A being irradiated with ultraviolet light, for example.

In the present embodiment, a case in which the first electrode 4 includes a thin film of the oxide semiconductor film 4A on the surface thereof, but the embodiment is not limited thereto. For example, the entirety of the first electrode 4 may be formed of the same material as that of the oxide semiconductor film 4A.

The light-emitting device 1 according to the present embodiment is manufactured by the same method as the method for manufacturing the light-emitting device 1 according to the aforementioned embodiments, In the method for manufacturing the light-emitting device 1 according to the present embodiment, only a mechanism in which the periphery of the quantum dots is heated differs in comparison with the method for manufacturing the light-emitting device 1 according to the aforementioned embodiments.

In each of the steps of the light irradiation, the oxide semiconductor film 4A is heated by absorbing the light with which the oxide semiconductor film 4A is irradiated. Thus, in each of the steps of the light irradiation, the heat from the oxide semiconductor film 4A, which absorbs light and generates heat, propagates to the applied solution, thereby causing the melting of the ligand contained in the solution and vaporization of the solvent to occur.

In the present embodiment as well, the density of quantum dots in the quantum dot layer can be raised and the luminous efficiency of the light-emitting device 1 can be improved for the same reason as that in the aforementioned embodiments, in general, a light absorption rate of an oxide semiconductor is significantly higher than that of a quantum dot. In addition, the oxide semiconductor converts most of energy of the absorbed light into heat, while the quantum dot converts part of energy of the absorbed light to light again. Accordingly, compared to the case where light is directly absorbed by the quantum dots to generate heat, the step of the light irradiation according to the present embodiment can more efficiently heat the periphery of the quantum dots. However, also in the present embodiment, the heating of the periphery of the quantum dots may be performed using the heat generated by the quantum dots absorbing light.

In the present embodiment as well, after the formation of the first electrode 4 including the oxide semiconductor film 4A, edge covers 14 and the first charge transport layer 6 are formed, and then the light-emitting layer 8 is formed. Due to this, during the step of forming the light-emitting layer 8, the heat from the oxide semiconductor film 4A propagates to the first electrode 4, the edge covers 14, and the first charge transport layer 6. Therefore, it is preferable that the first electrode 4, the edge covers 14, and the first charge transport layer 6 contain a material having heat resistance against the heating in the step of light irradiation described above.

In particular, when the light-emitting element layer 2 forms a bottom-emitting type light-emitting element and the first electrode 4 is an anode electrode, ITO is commonly used for the first electrode 4. ITO is preferable because it absorbs ultraviolet light and has high transmittance for visible light. In order to suppress an increase in specific resistance due to the heating in the above-mentioned heating step, the first electrode 4 preferably includes a material having high heat resistance such as a composite material of FTO and ITO.

In the present embodiment as well, the order of the formation of the light-emitting element layer 2 may be reversed. In other words, the light-emitting element layer 2 may form a top-emitting type light-emitting element and the second electrode 12 may be a cathode electrode. In this case, the light-emitting layer 8 is formed after the formation of the array substrate 3, the second electrode 12, the edge covers 14, and a second charge transport layer 10. in this case, it is preferable that the second electrode 12, the edge covers 14, and the second charge transport layer 10 contain a material having heat resistance against the heating in the above-described step of light irradiation.

In each of the embodiments described above, a case has been described in which the quantum dot layer including the quantum dots is the light-emitting layer 8. However, the embodiment is not limited thereto, and the first charge transport layer 6 or the second charge transport layer 10 may be the quantum dot layer including the quantum dots, for example. In this manner, in the case where each charge transport layer includes the quantum dots, these quantum dots may be provided with a function to transport carriers. In this case, in comparison with a charge transport layer including known quantum dots, the density of quantum dots in each charge transport layer is raised, so that the efficiency of carrier transport in each of the charge transport layers is improved, leading to an improvement in the luminous efficiency of the light-emitting device 1. Each of the charge transport layers including the quantum dots described above may also be formed by the same technique as the step of forming the quantum dot layer in each of the embodiments.

In each of the above-described embodiments, a display device including a plurality of light-emitting elements and having a display face DS is exemplified to describe the configuration of the light-emitting device 1. However, the disclosure is not limited thereto, and the light-emitting device 1 in each of the embodiments described above may be a light-emitting device including a single light-emitting element.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A method for manufacturing a light-emitting device provided with, on a substrate, a light-emitting element including a first electrode, a second electrode, and a quantum dot layer interposed between the first electrode and the second electrode, the method comprising:
   forming the quantum dot layer,
   the forming the quantum dot layer including
      performing first application that involves applying a first solution containing a plurality of first quantum dots each including a first core and a first shell with which the first core is coated, a first ligand to coordinate with each of the plurality of first quantum dots, and a first solvent on a position overlapping with the substrate,
      performing first light irradiation, subsequent to the performing first application, that involves irradiating with light using a first photomask, from above the substrate, the position where the first solution is applied, and forming a first exposure region exposed by the first light irradiation in which the first ligand melts and the first solvent vaporizes, and a first non-exposure region at a position different from a position exposed by the first light irradiation,
      performing first cooling, subsequent to the performing first light irradiation, that involves lowering a temperature of the first quantum dot to a temperature equal to or lower than a melting point of the first ligand and solidifying the first ligand, and
      performing first removal, subsequent to the performing first cooling, that involves washing an upper layer relative to the substrate with the first solvent to remove the first solution in the first non-exposure region.

2. The method for manufacturing the light-emitting device according to claim 1,
   wherein the forming the quantum dot layer further includes
   performing second application, subsequent to the performing first removal, that involves applying a second solution containing a plurality of second quantum dots each including a second core and a second shell with which the second core is coated, a second ligand to coordinate with each of the plurality of second quantum dots, and a second solvent on a position overlapping with the substrate,
   performing second light irradiation, subsequent to the performing second application, that involves irradiating with light using a second photomask, from above the substrate, the position where the second solution is applied, and forming a second exposure region exposed by the second light irradiation in which the second ligand melts and the second solvent vaporizes, and a second non-exposure region at a position different from a position exposed by the second light irradiation, performing second cooling, subsequent to the performing second light irradiation, that involves lowering a temperature of the second quantum dot to a temperature equal to or lower than a melting point of the second ligand and solidifying the second ligand, and performing second removal, subsequent to the performing second cooling, that involves washing an upper layer relative to the substrate with the second solvent to remove the second solution in the second non-exposure region.

3. The method for manufacturing the light-emitting device according to claim 2, wherein the forming the quantum dot layer further includes performing third application, subsequent to the performing second removal, that involves applying a third solution containing a plurality of third quantum dots each including a third core and a third shell with which the third core is coated, a third ligand to coordinate with each of the plurality of third quantum dots, and a third solvent on a position overlapping with the substrate, performing third light irradiation, subsequent to the performing third application, that involves irradiating with light using a third photomask, from above the substrate, the position where the third solution is applied, and forming a third exposure region exposed by the third light irradiation in which the third ligand melts and the third solvent vaporizes, and a third non-exposure region at a position different from a position exposed by the third light irradiation, performing third cooling, subsequent to the performing third light irradiation, that involves lowering a temperature of the third quantum dot to a temperature equal to or lower than a melting point of the third ligand and solidifying the third ligand, and performing third removal, subsequent to the performing third cooling, that involves washing an upper layer relative to the substrate with the third solvent to remove the third solution in the third non-exposure region.

4. The method for manufacturing the light-emitting device according to claim 3, wherein the first exposure region, the second exposure region, and the third exposure region respectively correspond to a plurality of light-emitting elements having mutually different luminescent colors.

5. The method for manufacturing the light-emitting device according to claim 3, wherein each of the first exposure region, the second exposure region, and the third exposure region corresponds to any of a red light-emitting element, a green light-emitting element, and a blue light-emitting element.

6. The method for manufacturing the light-emitting device according to claim 5, wherein diameters of the first core, the second core, and the third core are different from each other.

7. The method for manufacturing the light-emitting device according to claim 6, wherein, among the cores including the first core, the second core, and the third core, the diameter of the core at a position that overlaps with the exposure region corresponding to the green light-emitting element is smaller than the diameter of the core at a position that overlaps with the exposure region corresponding to the red light-emitting element and is greater than the diameter of the core at a position that overlaps with the exposure region corresponding to the blue light-emitting element.

8. The method for manufacturing the light-emitting device according to claim 5, wherein irradiation energies of light irradiation in the performing first light irradiation, the performing second light irradiation, and the performing third light irradiation differ from each other.

9. The method for manufacturing the light-emitting device according to claim 8, wherein the irradiation energy of light irradiation onto the exposure region corresponding to the green light-emitting element is greater than the irradiation energy of light irradiation onto the exposure region corresponding to the red light-emitting element and is smaller than the irradiation energy of light irradiation onto the exposure region corresponding to the blue light-emitting element.

10. The method for manufacturing the light-emitting device according to claim 3, herein the first quantum dot, the second quantum dot, and the third quantum dot absorb emitted light and generate heat in the performing first light irradiation, the performing second light irradiation, and the performing third light irradiation, respectively.

11. The method for manufacturing the light-emitting device according to claim 3, wherein the forming the quantum dot layer further includes individually forming electrodes each including a reflective metal thin film on a surface of the electrode at positions that respectively overlap with the first exposure region, the second exposure region, and the third exposure region, prior to the performing first application.

12. The method for manufacturing the light-emitting device according to claim 3, wherein the forming the quantum dot layer further includes, individually forming electrodes each including an oxide semiconductor film on a surface of the electrode at positions that respectively overlap with the first exposure region, the second exposure region, and the third exposure region, prior to the performing first application.

13. The method for manufacturing the light-emitting device according to claim 12, wherein the oxide semiconductor film absorbs emitted light and generates heat in each of the performing first light irradiation, the performing second light irradiation, and the performing third light irradiation.

14. The method for manufacturing the light-emitting device according to claim 1, wherein a melting point of the ligand is lower than or equal to a boiling point of the solvent, and the solvent vaporizes after the ligand melts in any of the performing light irradiation in the forming the quantum dot layer.

15. The method for manufacturing the light-emitting device according to claim 1, wherein the melting point of the ligand is higher than the boiling point of the solvent, and the ligand melts after the solvent vaporizes in any of the performing light irradiation in the forming the quantum dot layer.

* * * * *